US008829930B2

(12) United States Patent
List, III et al.

(10) Patent No.: US 8,829,930 B2
(45) Date of Patent: Sep. 9, 2014

(54) RAPID SCREENING BUFFER LAYERS IN PHOTOVOLTAICS

(75) Inventors: Frederick Alyious List, III, Andersonville, TN (US); Enis Tuncer, Menands, NY (US)

(73) Assignee: UT-Battelle, LLC, Oak Ridge, TN (US)

( * ) Notice: Subject to any disclaimer, the term of this patent is extended or adjusted under 35 U.S.C. 154(b) by 609 days.

(21) Appl. No.: 13/019,024

(22) Filed: Feb. 1, 2011

(65) Prior Publication Data

US 2012/0194205 A1 Aug. 2, 2012

(51) Int. Cl.
| G01R 27/08 | (2006.01) |
| G01R 31/26 | (2014.01) |
| G01R 1/073 | (2006.01) |
| G01R 27/02 | (2006.01) |

(52) U.S. Cl.
CPC ............ *G01R 31/2648* (2013.01); *G01R 27/02* (2013.01); *G01R 1/07314* (2013.01)
USPC ............ 324/724; 324/715; 324/719; 600/547

(58) Field of Classification Search
USPC .......................................... 324/724
See application file for complete search history.

(56) References Cited

U.S. PATENT DOCUMENTS

| 3,456,186 A * | 7/1969 | Bush et al. ..................... 324/715 |
| 3,497,802 A | 2/1970 | Biddle | |
| 4,383,217 A | 5/1983 | Shiell | |
| 5,602,486 A | 2/1997 | Novak | |
| 6,218,846 B1 | 4/2001 | Ludwig et al. | |
| 7,052,763 B2 * | 5/2006 | Swift et al. .................. 428/300.4 |
| 2001/0023702 A1 * | 9/2001 | Nakagawa et al. ........... 136/244 |
| 2004/0254457 A1 * | 12/2004 | van der Weide ............. 600/430 |
| 2011/0146768 A1 * | 6/2011 | Lu ................................ 136/255 |

OTHER PUBLICATIONS

Zhang, Xuejun et al., Mass-Productions of Vertically Aligned Extremely Long Metallic Micro/Nanowires Using Drawing Nonmanufacturing, 2008, Adanced Materials, 20, pp. 1310-1314.*
Keithley Instuments, Inc., "Electrical Characterization of Photovoltaic Materials and Solar Cells with the Model 4200-SCS Semiconductor Characterization System," Application Note Series, Jun. 2, 2006, No, 3026 (15 pages).

* cited by examiner

*Primary Examiner* — Melissa Koval
*Assistant Examiner* — Stephen G Armstrong
(74) *Attorney, Agent, or Firm* — Pauley Petersen & Erickson

(57) ABSTRACT

An apparatus and method of testing electrical impedance of a multiplicity of regions of a photovoltaic surface includes providing a multi-tipped impedance sensor with a multiplicity of spaced apart impedance probes separated by an insulating material, wherein each impedance probe includes a first end adapted for contact with a photovoltaic surface and a second end in operable communication with an impedance measuring device. The multi-tipped impedance sensor is used to contact the photovoltaic surface and electrical impedance of the photovoltaic material is measured between individual first ends of the probes to characterize the quality of the photovoltaic surface.

12 Claims, 3 Drawing Sheets

_(1)_
RAPID SCREENING BUFFER LAYERS IN PHOTOVOLTAICS

GOVERNMENT RIGHTS

This invention was made with government support under Contract No. DE-AC05-00OR22725 awarded by the U.S. Department of Energy. The government has certain rights in the invention.

FIELD OF THE INVENTION

The present invention relates to a technique for quickly screening buffer layers in photovoltaics.

BACKGROUND OF THE INVENTION

A need exists for large scale dielectric materials/layers having sufficient capacity for use in specialized applications like solar cells, defense, aerospace and transportation. Further, characterization of such dielectric materials/layers for such applications as large area solar cells is needed to screen candidate materials and process in the manufacturing stage.

SUMMARY OF THE INVENTION

Impedance measurements provide a useful method to assess electrical properties of materials such that depending on the test frequency one can obtain whether the material has low or high resistance, in other words, whether such material is conducting or dielectric, respectively. There is no unique method to characterize large substrate areas for photovoltaic applications where a dielectric layer is deposited on a substrate, such as a rolling assisted biaxially textured substrate ("RABiTs"). Good insulation of the dielectric is essential for device performance.

To screen materials and processes, one can measure the impedance with a small metal contact/electrode and apply a voltage between the contact and a bottom of the substrate. In that case, the quality of the dielectric material under the small contact/electrode can be obtained. However, performing such repeated measurements on a large substrate is cumbersome and potentially unreliable.

The subject invention describes a method to measure the impedance of many spots on a large substrate simultaneously. According to a preferred embodiment, an array of conducting polymeric rods and/or discs is preferably utilized as an upper contact which will sit on the substrate. A bottom electrode is provided by the RABiTs substrate under the dielectric layer. Each rod and/or disc is preferably accessed through a switchboard which is connected to an impedance analyzer for impedance measurements. The system can preferably characterize the whole surface and the dielectric such that the variations in the material and process conditions can be monitored.

BRIEF DESCRIPTION OF THE DRAWINGS

The above-mentioned and other features and objects of this invention will be better understood from the following detailed description taken in conjunction with the drawings wherein.

DETAILED DESCRIPTION OF THE INVENTION

Figure 1:
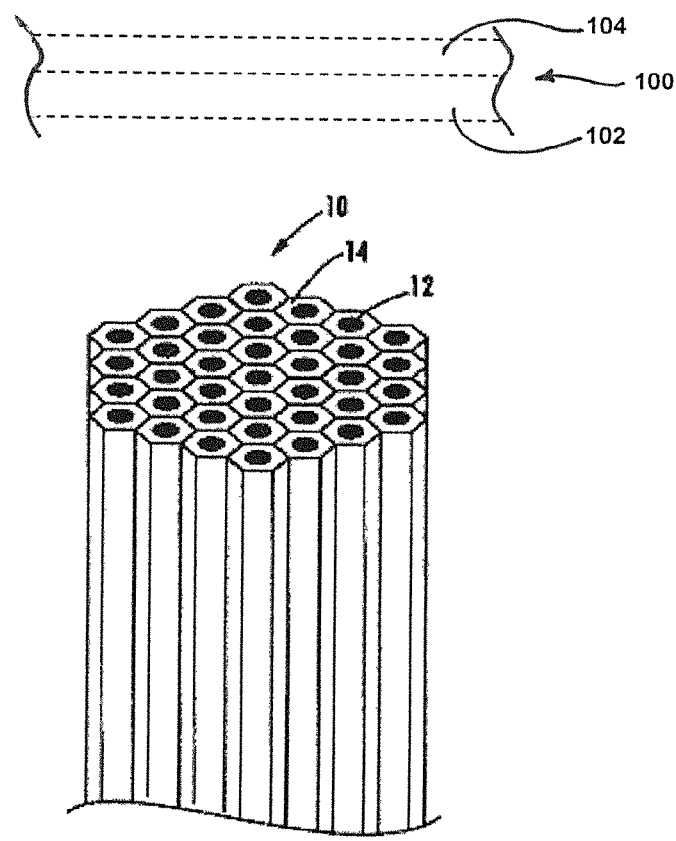
FIG. 1 is a schematic perspective side view of an array of conducting rods according to one preferred embodiment of this invention.

According to a preferred embodiment of this invention, materials and processes, specifically photovoltaic substrates 100, are screened using a measured impedance following application of a voltage between a contact and a bottom of the substrate, such as a rolling assisted biaxially textured substrate ("RABiTs"). In this manner, the quality of the dielectric substrate 102 under investigation can be obtained.

The subject invention describes a method and apparatus to measure the impedance of many spots on a large substrate simultaneously. In the invention, and as shown schematically in FIGS. 1 and 2, an impedance sensor 15 comprising an array 10 of conducting polymeric conducting rods 20 and/or discs is preferably utilized as an upper contact which will sit on the substrate. The arrays 10 shown in the figures are shown schematically and, as such, the scale and relationship of the various components may be adjusted for clarity and discussion.

Figure 2:
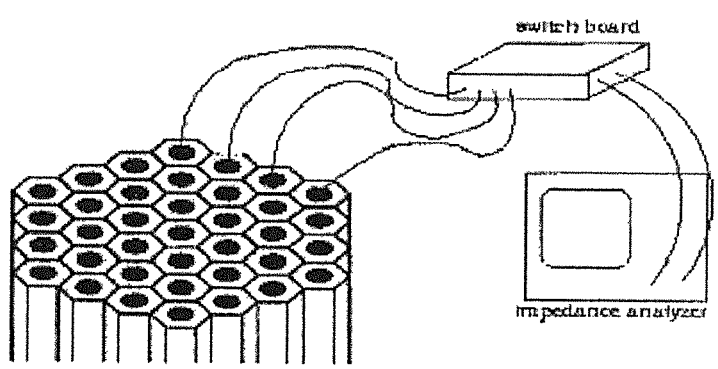
FIG. 2 is a schematic perspective side view of a system for testing electrical impedance according to one preferred embodiment of this invention.

The bottom of the RABiTs substrate 100 under the dielectric layer 102 provides a bottom electrode 104 for the impedance sensor 15 described herein. Each conducting rod 20 and/or disc is accessed through a switchboard 60 which is preferably connected with respect to an impedance analyzer 80 for the measurements, such as shown in FIG. 2. The system can characterize the whole substrate surface and the dielectric 102 such that the variations in the material and process conditions can be monitored and/or characterized.

According to a preferred embodiment of the invention, a multi-tipped impedance sensor 15 includes a multiplicity or array 10 of conducting rods 20, also referred to as impedance probes, arranged in a manner so as to not damage or destroy the substrate surface. The conducting rods 20 are preferably constructed of a soft polymeric material that is easy to process. The conducting rods 20 may be a polymeric composite which is filled with carbon sud, conducting nanotubes, conducting polymer or metals.

Each conducting rod 20 (or impedance probe) includes a first end adapted for contact with the photovoltaic surface and a second end in operable communication with the impedance measuring device 80 to measure the electrical impedance of the photovoltaic material between individual first ends of the conducting rods. As shown in FIG. 2, a switchboard 60 may be connected between the impedance measuring device 80 and the multi-tipped impedance sensor 15.

The array 10 further includes an insulating material 30 which separates conducting rods 20 from each other. The insulating material 30 is preferably a ductile, electrically insulating material positioned around each conducting rod 20. According to a preferred embodiment of this invention, the electrically insulating material 30 is preferably a dielectric material having a high dielectric permittivity such as glass or polymer but may comprise any suitable material selected from the group consisting of: glass, ceramic, polymer and resin. More specifically, the insulating material 30 may be selected from the group consisting of soda-lime glass, boron-silicate glass, potash-lead-silicate glass, polymeric material, and combinations thereof.

Fabrication of such an array 10 may be achieved using drawing techniques. Specifically, a sub-array may be formed in any desirable geometry so as to affect the desired scale and/or shape for a particular application. FIG. 1 shows the array 10 comprising a plurality of generally hexagonal sub-arrays comprising seven conducting rods 20 each. Preferably, each conducting rod 20 of the multiplicity of spaced apart conducting rods 20 is directly adjacent at least three other conducting rods 20. The sub-array may be grouped in bulk in a square, tessellated, or other desirably shaped lattice, that is, a series of sub-arrays arranged into a square matrix such that sub-arrays are arranged in units to form the array 10. Following assembly of the sub-arrays into the array 10, the array 10 may be heated to a temperature sufficient to soften the ductile components. Once heated to a sufficient temperature, the array 10 is then drawn along a longitudinal axis to reduce an overall diameter of the array 10 and extend an overall length of the array 10 and thereby unitized into a suitable unitized array 10 for use in connection with the subject invention.

The number of rods 20 within the array 10 in the impedance sensor 15 may be increased significantly with manufacturing techniques similar to those described above. The array 10 may be tessellated to cover larger areas for applications requiring such coverage.

Figure 3:
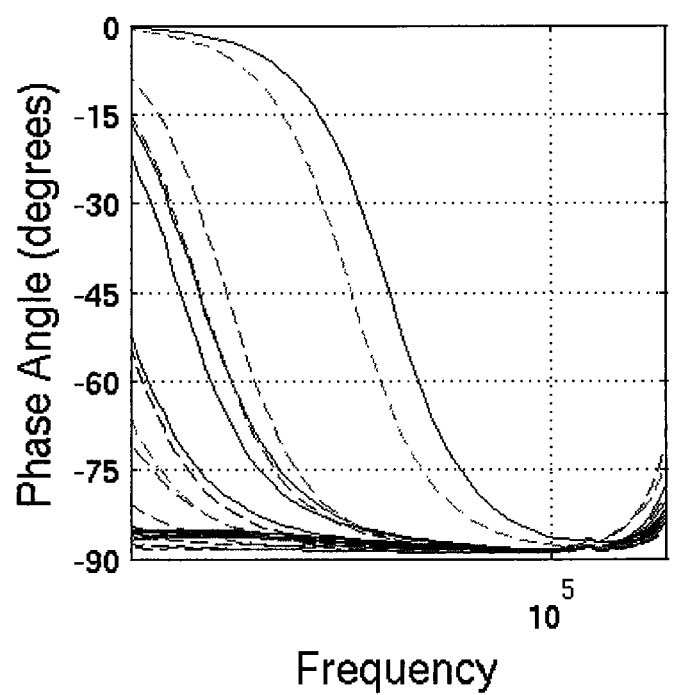
FIG. 3 is a graph showing phase angles at different locations on a substrate.

An example of an impedance measurement performed on a ½ inch×½ inch substrate is shown in FIG. 3. The phase angle in the impedance is plotted in the figure. Good or acceptable spots on the substrate should yield phase angles of approximately 90 degrees. Spots with phase angle values other than approximately 90 degrees are considered defective.

Figure 4:
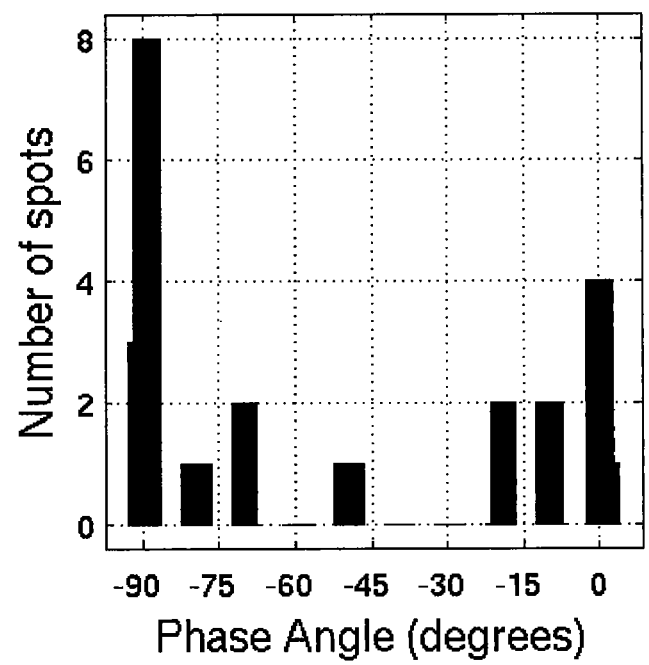
FIG. 4 is a graph showing distribution of phase angles for treated and untreated samples.

Influence of the post-treatment of a substrate on the phase angle is shown in FIG. 4, where an untreated substrate sample is shown in dark bars and a treated sample is presented with light bars. The number of spots with desired values is 8 out of 13 for a treated substrate sample, while the same ratio is 3 out of 12 for an untreated substrate sample. However, it is desirable to extend the described analysis to much larger substrate sample areas than the ½ inch×½ inch electrode arrangement and measuring system shown in FIGS. 3 and 4.

While there has been shown and described what are at present considered the preferred embodiments of the invention, it will be obvious to those skilled in the art that various changes and modifications can be prepared therein without departing from the scope of the inventions defined by the appended claims.

What is claimed is:

1. A method of testing electrical impedance of a multiplicity of regions of a photovoltaic surface comprising the steps of:
    a. providing a multi-tipped impedance sensor comprising a tip of only a multiplicity of spaced apart impedance probes separated by an insulating material extending from a first end to a second end of the each impedance probe, each impedance probe of the multiplicity of spaced apart impedance probes directly adjacent at least three other impedance probes, and each impedance probe having the first end adapted for contact with a photovoltaic surface and the second end in operable communication with an impedance measuring device;
    b. contacting the multi-tipped impedance sensor with a surface of a dielectric layer of a photovoltaic surface, the surface being on a side of the dielectric layer that is opposite a side comprising an electrode for the impedance sensor; and
    c. measuring electrical impedance of the dielectric layer between individual first ends of the probes.

2. The method of claim 1 wherein the insulating material comprises a material selected from the group consisting of: glass, ceramic, polymer and resin.

3. The method of claim 1 wherein the multiplicity of spaced apart impedance probes are tessellated.

4. The method of claim 1 wherein the multiplicity of spaced apart impedance probes are arranged in sub-systems defined by seven probes.

5. The method of claim 1 further comprising the step of:
    d. plotting phase angles of the electrical impedance to determine acceptable spots on the photovoltaic surface.

6. The method of claim 5 wherein phase angles of approximately 90 degrees yield the acceptable spots.

7. A method of testing electrical impedance of a photovoltaic surface comprising the steps of:
    a. providing a multi-tipped impedance sensor including a tessellated array of individual conducting rods, each conducting rod having a first end adapted for contact with a photovoltaic surface and a second end in operable communication with an impedance measuring device, each conducting rod separated from an adjacent conducting rod by an insulating material extending from the first end to the second end;
    b. contacting the multi-tipped impedance sensor with a section of photovoltaic surface corresponding in size with the array of individual conducting rods, wherein the photovoltaic surface is on a side that is opposite a side comprising an electrode for the impedance sensor, and
    c. measuring electrical impedance of the photovoltaic material between individual first ends of the conducting rods.

8. The method of claim 7 further comprising the step of:
    d. plotting phase angles of the electrical impedance to determine acceptable spots on the photovoltaic surface where the phase angle equals approximately 90 degrees.

9. The method of claim 7 wherein each conducting rod comprises:
    a ductile, electrically conductive fiber, and
    a ductile, electrically insulating cladding positioned around the fiber.

10. The method of claim 7 wherein each conducting rod of the multiplicity of the array of conducting rods is directly adjacent at least three other conducting rods.

11. The method of claim 7 wherein the array of conducting rods are arranged in hexagonal sub-arrays defined by seven conducting rods.

12. The method of claim 7 wherein the conducting rod comprises a polymeric composite filled with at least one of carbon sud, conducting nanotubes, conducting polymer and metals.

* * * * *